(12) United States Patent
Favennec et al.

(10) Patent No.: US 9,711,550 B2
(45) Date of Patent: Jul. 18, 2017

(54) PINNED PHOTODIODE WITH A LOW DARK CURRENT

(71) Applicants: STMicroelectronics SA, Montrouge (FR); STMicroelectronics (Crolles 2) SAS, Crolles (FR)

(72) Inventors: Laurent Favennec, Villard Bonnot (FR); Didier Dutartre, Meylan (FR); Francois Roy, Seyssins (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/840,680

(22) Filed: Aug. 31, 2015

(65) Prior Publication Data

US 2016/0104729 A1    Apr. 14, 2016

(30) Foreign Application Priority Data

Oct. 10, 2014  (FR) ...................................... 14 59727

(51) Int. Cl.
*H01L 27/146* (2006.01)
*H01L 31/11* (2006.01)
*H01L 31/18* (2006.01)

(52) U.S. Cl.
CPC ...... *H01L 27/1462* (2013.01); *H01L 27/1461* (2013.01); *H01L 27/1463* (2013.01); *H01L 27/14612* (2013.01); *H01L 27/14685* (2013.01); *H01L 27/14689* (2013.01); *H01L 31/11* (2013.01); *H01L 31/1804* (2013.01); *Y02E 10/547* (2013.01); *Y02P 70/521* (2015.11)

(58) Field of Classification Search
CPC ........... H01L 27/1462; H01L 27/14685; H01L 27/14612; H01L 27/1461; H01L 27/1463; H01L 27/14689; H01L 31/1804; H01L 31/11; Y02P 70/521; Y02E 10/547
See application file for complete search history.

(56) References Cited

U.S. PATENT DOCUMENTS

| 6,677,656 | B2 | 1/2004 | Francois |
| 7,902,624 | B2 * | 3/2011 | Rhodes ............. H01L 27/14603 257/446 |
| 8,921,187 | B2 | 12/2014 | Chen et al. |
| 2004/0251398 | A1 | 12/2004 | Mouli et al. |
| 2006/0267013 | A1 | 11/2006 | Adkisson et al. |

OTHER PUBLICATIONS

Fossum, Eric R. et al., "A Review of the Pinned Photodiode for CCD and CMOS Image Sensors," IEEE Journal of the Electron Devices Society 2(3):33-43, May 2014.

* cited by examiner

*Primary Examiner* — William Coleman
(74) *Attorney, Agent, or Firm* — Seed IP Law Group LLP

(57) ABSTRACT

A method of manufacturing a pinned photodiode, including: forming a region of photon conversion into electric charges of a first conductivity type on a substrate of the second conductivity type; coating said region with a layer of a heavily-doped insulator of the second conductivity type; and annealing to ensure a dopant diffusion from the heavily-doped insulator layer.

18 Claims, 2 Drawing Sheets

PINNED PHOTODIODE WITH A LOW DARK CURRENT

BACKGROUND

Technical Field

The present disclosure relates to a pinned photodiode with a low dark current, capable of forming a pixel of an array image sensor.

Description of the Related Art

Accompanying FIG. 1 corresponds to FIG. 2 of U.S. Pat. No. 6,677,656. This drawing is a partial simplified cross-section view of a monolithic embodiment of the assembly of a photodiode and of an associated transfer transistor. These elements are formed in a same active area of an epitaxial layer 3 formed on a semiconductor substrate 1. The active area is delimited by field insulation areas 2, for example, made of silicon oxide ($SiO_2$). Epitaxial layer 3 is lightly P-type doped. Substrate 1 is also of type P but more heavily-doped. Above the surface of layer 3 is formed an insulated gate structure 4, possibly provided with lateral spacers. On either side of gate 4, at the surface of well 3, are located N-type source and drain regions 5 and 6. Drain region 6, to the right of gate 4, is heavily doped ($N^+$). Source region 5 is formed on a much larger surface area than drain region 6 and forms the useful region where photons are converted into electric charges. Gate 4 and drain 6 are integrate with metallizations (not shown). The structure is completed with heavily-doped P-type regions 8 and 9 ($P^+$). Regions 8 and 9, bordering insulating areas 2, are connected to the reference voltage or ground via well 3 and substrate 1.

The photodiode further comprises, at the surface of its source region 5, a P-type layer 7 in lateral contact with region 8. It is thus permanently maintained at the reference voltage level. The useful region where photons are converted into electric charges, source region 5, is electrically floating. Such a photodiode is called "pinned diode".

FIG. 2 shows the distribution of the dopant atom concentrations in a direction x perpendicular to the main plane of layers 7, 5, 9, and 3. In the shown case, epitaxial layer 3 is of constant doping, for example, in the range from $5 \times 10^{14}$ to $3.10^{15}$ at./cm$^3$. The N region 5 is obtained by implantation and has a maximum concentration in the range from $10^{16}$ to $8 \times 10^{17}$ at./cm$^3$. Layer 7 is obtained by implantation. Inevitably, if the implantation dose used to form layer 7 is higher, the junction depth between regions 7 and 5 is larger. The case of a first maximum concentration $c_1$ in the range from 1 to $2 \times 10^{18}$ at./cm$^3$ for which the junction depth is equal to $x_{j1}$ in the range from 30 to 50 nm and the case of a second implantation having a maximum concentration in the range from $5 \times 10^{18}$ to $5.10^{19}$ at./cm$^3$ and having a junction depth equal to $x_{j2}$ in the range from 100 to 250 nm have been shown.

If the photons, and particularly the photons corresponding to blue, are desired to be properly absorbed, layer 7 should be as thin as possible. Indeed, in blue (for a 450-nm wavelength), substantially 50% of the photons are absorbed in the first 170 nm. The thickness of layer 7 should thus be much smaller than this value. As a result, its maximum concentration, and particularly its surface concentration, is no greater than $10^{18}$ at./cm$^3$. In a practical implementation, after having formed the structure of FIG. 1, said structure is coated with an insulator layer, currently silicon oxide. Now, it is known that at the interface between a doped region and silicon oxide, a temperature-activated generation of electron-hole pairs, some of which will go into the N layer, will occur. Thus, even in the absence of illumination, region N charges. This corresponds to what is called dark current. This dark current is desired to be as low as possible.

BRIEF SUMMARY

Thus, an embodiment provides a method of manufacturing a pinned photodiode, comprising forming a conversion region of photons into electric charges of a first conductivity type on a substrate of the second conductivity type; coating said region with a layer of a heavily-doped insulator of the second conductivity type; and annealing to provide a dopant diffusion from the heavily-doped insulator layer.

According to an embodiment, the conversion region is of type N and the layer of a heavily-doped insulator is boron-doped silicon oxide, BSG.

According to an embodiment, the boron-doped silicon oxide layer is doped with a boron concentration from $5 \times 10^{21}$ to $2 \times 10^{22}$ at./cm$^3$.

According to an embodiment, the anneal is performed in conditions such that the penetration depth of the dopants in the semiconductor region underlying the heavily-doped insulator layer of the second conductivity type is smaller than 50 nm, and preferably smaller than 10 nm.

According to an embodiment, the conversion region is coated with an implanted layer of the second conductivity type with a maximum doping level in the range from $10^{17}$ to $10^{18}$ at./cm$^3$ before its coating with the layer of a heavily-doped insulator.

An embodiment provides a pinned photodiode, having its upper semiconductor layer coated with a layer of a heavily-doped insulator.

According to an embodiment, the region of photon conversion into electric charges is of type N and the layer of a heavily-doped insulator is boron-doped silicon oxide, BSG, at a boron concentration from $5 \times 10^{21}$ to $2 \times 10^{22}$ at./cm$^3$.

The foregoing and other features and advantages will be discussed in detail in the following non-limiting description of specific embodiments in connection with the accompanying drawings.

As usual in the representation of integrated circuits, the various cross-section views are not to scale. Further, in the following description, unless otherwise indicated, terms "approximately", "in the order of", etc., mean "to within 10%", and terms referring to directions, such as "upper", "lower", "lateral", "horizontal", "vertical", etc., apply to devices arranged as illustrated in the corresponding cross-section views, it being understood that, in practice, the devices may have different directions.

DETAILED DESCRIPTION

Figure 3:
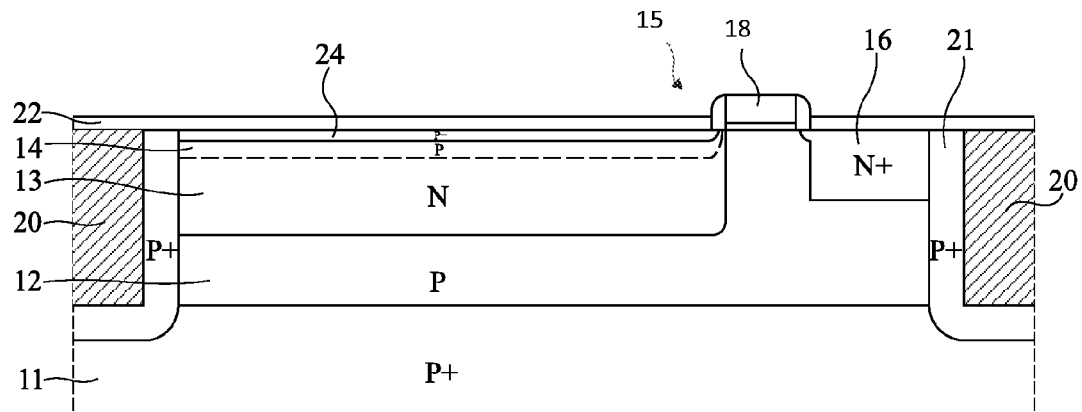
FIG. 3 is a cross-section view showing a second embodiment of a pinned photodiode having a low dark current.

FIG. 3 is a cross-section view showing an embodiment of pinned photodiode having a low dark current. This photodiode comprises, on a heavily-doped P-type substrate 11, a layer 12 which is also P-type doped, preferably formed by epitaxy, inside of which is formed an N-type doped well 13 having a shallow P-type region 14, that is, a region of a depth smaller than 100 nm, preferably smaller than 75 nm, formed therein by implantation. As previously, a transfer MOS transistor 15 is formed and includes region 13, which forms its source, a heavily-doped N-type region 16, which forms its drain, and a gate 18. The pixel particularly comprising photodiode 12, 13, 14, and the transistor is delimited by a deep trench 20 preferably extending all the way to substrate 11. This deep trench is bordered with a heavily-doped P-type region 21, preferably formed by diffusion from a heavily-doped material contained in the insulator filling trench 20.

The structure is coated with a layer 22 of a heavily-doped insulator. This insulator will for example be, in the case of the previously-indicated conductivity types, a layer of borosilicate glass, or in other words of heavily boron-doped silicon oxide. Thus, after the anneals resulting from subsequent manufacturing steps, the boron contained in layer 22 has a very shallow diffusion at a very high concentration in the underlying semiconductor. A heavily-doped P-type layer 24 thus forms at the surface of region 14. It should be noted that the diffusion does not affect the $N^+$ regions, which have a much stronger doping.

Figure 4:
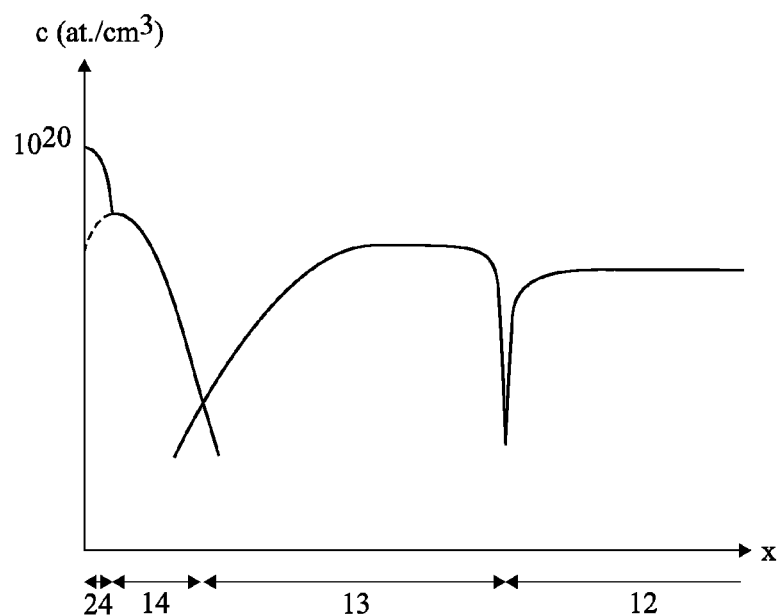
FIG. 4 shows concentration variations according to depth for a structure of the type in FIG. 3.

Preferably, the doping levels and the anneal times of the various layers are selected to obtain, perpendicularly to layers 24, 14, 13, and 12, a concentration profile of the type shown in FIG. 4.

Figure 1:
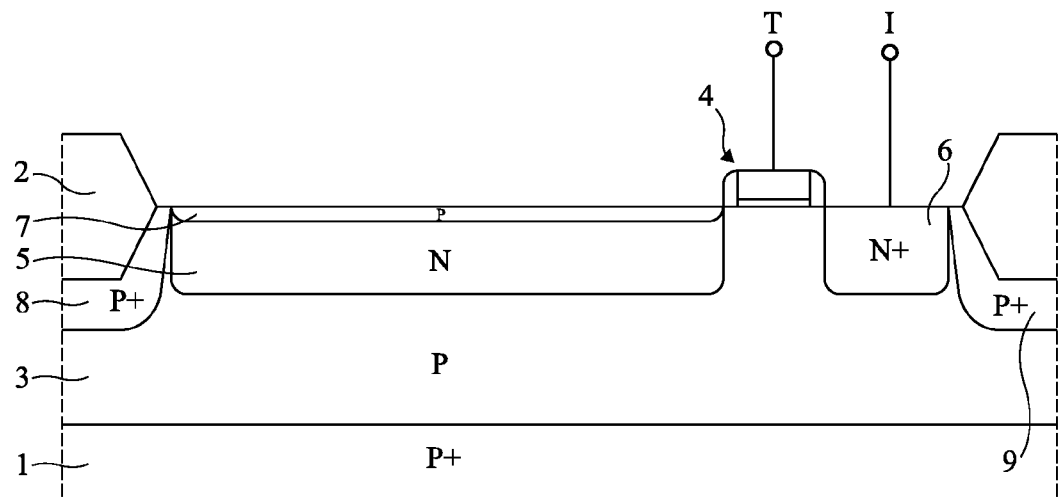
FIG. 1 is a simplified cross-section view corresponding to FIG. 2 of U.S. Pat. No. 6,677,656.
Figure 2:
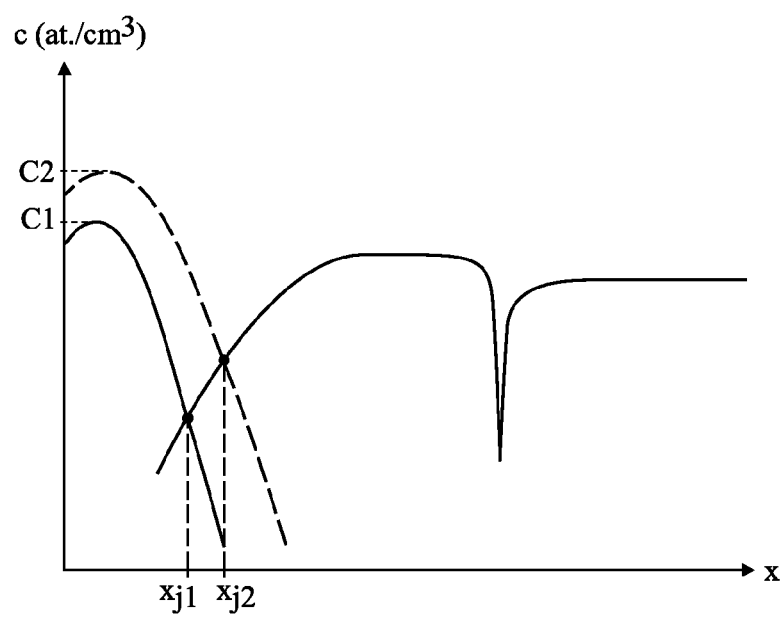
FIG. 2 shows concentration variations according to depth for a structure of the type in FIG. 1.

It can thus be observed that if layer 14 is moderately doped (for example, at a maximum doping on the order of $10^{18}$ at./cm$^3$), due to the presence of layer 24, a shallow layer having a maximum doping at the level of the upper oxide on the order of $10^{20}$ at./cm$^3$. As a result, the dark current generation becomes negligible at the interface between a very heavily-doped region and an upper insulator. Indeed, the generation of electron-hole pairs at the interface between an insulating layer and a semiconductor layer decreases when the semiconductor doping (for example, silicon) increases. As an example, a measurement at 60° C. shows that the dark current is 100 pA/cm$^2$ for a device of the type in FIG. 1 and is approximately half thereof for a device of the type in FIG. 3.

In a manufacturing mode, after having formed lateral insulations 20 and 21 and then MOS device 15 comprising insulated gate 18 and N-type source area 13, a silicon oxide layer 22 having a thickness approximately in the range from 5 to 20 nm (for example, 10 nm) doped with boron at a concentration in the range from $5 \times 10^{21}$ to $2 \times 10^{22}$ at./cm$^3$, for example, $1 \times 10^{22}$ at./cm$^3$, is deposited.

The embodiment described herein is likely to have many variations. For example, all the conductivity types of the photodiode may be inverted. In this case, the heavily boron-doped insulator layer will be replaced with an insulator layer heavily doped with arsenic or phosphorus (for example, PSG).

The specific form of the shown pinned photodiode is an example only. Other forms of photodiodes may be used as well as other transfer transistor layouts. Further, in each pixel comprising a photodiode and a transfer transistor, other elements will be preferably integrated, for example, a reset transistor.

In FIG. 3, the limit of P-type layer 14 has been indicated with dotted lines. This illustrates the fact that this layer is optional. It is possible to only provide the very thin layer of high doping level resulting from the diffusion of the dopant contained in the insulator covering the structure. On the other hand, doping insulator 22 has been shown as covering the entire structure. In specific embodiments, a previous etching of this insulator may be provided so that it only covers useful regions of the photodiode.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method comprising:
   manufacturing a pinned photodiode, the manufacturing including:
   forming a conversion region of a first conductivity type on a substrate of a second conductivity type, the conversion region being configured to convert photons into electric charges;
   forming a shallow semiconductor region of the second conductivity type on the conversion region;
   coating said shallow semiconductor region with a heavily-doped insulator layer that is doped with dopants of the second conductivity type, the shallow semiconductor region being positioned between the conversion region and the heavily-doped insulation layer; and
   providing a dopant diffusion from the heavily-doped insulator layer into the shallow semiconductor region, wherein:
   the shallow semiconductor region is formed on the conversion region prior to coating said shallow semiconductor region with the heavily-doped insulator layer; and
   providing the dopant diffusion includes forming a diffusion layer of the second conductivity type in an upper portion of the shallow semiconductor region, the diffusion layer having a doping level that is higher than a doping level of the shallow semiconductor region.

2. The method of claim 1, wherein the conversion region is of type N and the layer of a heavily-doped insulator is a boron-doped silicon oxide layer.

3. The method of claim 1, wherein providing the dopant diffusion includes diffusing dopants from the heavily-doped insulator layer into the shallow semiconductor region to a penetration depth smaller than 50 nm.

4. The method of claim 1, wherein forming the shallow semiconductor region includes coating the conversion region with the shallow semiconductor region with a maximum doping level in a range from $10^{17}$ to $10^{18}$ at./cm$^3$ before coating the shallow semiconductor region with the heavily-doped insulator layer.

5. The method of claim 1, wherein providing the dopant diffusion includes annealing the heavily-doped insulator layer and forming a heavily-doped diffusion layer of the second conductivity type having a doping level that is greater than a doping level of the shallow semiconductor region.

6. The method of claim 2, wherein the boron-doped silicon oxide layer is doped with a boron concentration from $5 \times 10^{21}$ to $2 \times 10^{22}$ at./cm$^3$.

7. The method of claim 3, wherein the penetration depth is smaller than 10 nm.

8. A pinned photodiode, comprising:
a conversion region of a first conductivity type formed on a substrate of a second conductivity type, the conversion region being configured to convert photons into electric charges;
a diffusion layer of the second conductivity type formed on the conversion region;
a shallow semiconductor region of the second conductivity type positioned between the diffusion layer and the conversion region; and
a heavily-doped insulator layer that coats the diffusion layer, the heavily-doped insulator layer being of the second conductivity type.

9. The pinned photodiode of claim 8, wherein the heavily-doped insulator layer is boron-doped silicon oxide at a boron concentration from $5 \times 10^{21}$ to $2 \times 10^{22}$ at./cm$^3$.

10. The pinned photodiode of claim 8, wherein the diffusion layer has a depth of less than 50 nm.

11. The pinned photodiode of claim 8, wherein the shallow semiconductor region has a maximum doping on the order $10^{18}$ at./cm$^3$ and the diffusion layer has a maximum doping on the order $10^{20}$ at./cm$^3$.

12. The pinned photodiode of claim 8, wherein said diffusion layer has a doping level that is higher than a doping level of the shallow semiconductor region.

13. A device, comprising:
a transfer transistor; and
a pinned photodiode, the pinned photodiode including:
  a conversion region of a first conductivity type formed on a substrate of a second conductivity type, the conversion region being configured to convert photons into electric charges;
  a diffusion layer of the second conductivity type formed on the conversion region;
  a shallow semiconductor region of the second conductivity type positioned between the diffusion layer and the conversion region; and
  a heavily-doped insulator layer that coats the diffusion layer, the heavily-doped insulator layer being of the second conductivity type.

14. The device of claim 13, wherein the heavily-doped insulator layer is boron-doped silicon oxide at a boron concentration from $5 \times 10^{21}$ to $2 \times 10^{22}$ at./cm$^3$.

15. The device of claim 13, wherein the diffusion layer has a depth of less than 10 nm.

16. The device of claim 13, wherein the transfer transistor includes an insulated gate, a drain, and a source, the source being at least a portion of the conversion region.

17. The device of claim 13, wherein said diffusion layer has a doping level that is higher than a doping level of the shallow semiconductor region.

18. The device of claim 15, wherein the shallow semiconductor region has a maximum doping on the order $10^{18}$ at./cm$^3$ and the diffusion layer has a maximum doping on the order $10^{20}$ at./cm$^3$.

* * * * *